(12) United States Patent
Monadgemi (10) Patent No.: US 12,191,284 B2
(45) Date of Patent: Jan. 7, 2025

(54) THERMALLY EFFICIENT SEMICONDUCTOR DEVICE ASSEMBLIES INCLUDING INTERPOSERS CARRYING A SUBSET OF THE EXTERNAL CONTACTS OF THE ASSEMBLY, AND METHODS OF MAKING THE SAME

(71) Applicant: Micron Technology, Inc., Boise, ID (US)

(72) Inventor: Pezhman Monadgemi, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/231,192

(22) Filed: Aug. 7, 2023

(65) Prior Publication Data
US 2023/0378137 A1 Nov. 23, 2023

Related U.S. Application Data

(63) Continuation of application No. 17/384,729, filed on Jul. 24, 2021, now Pat. No. 11,742,328.

(60) Provisional application No. 63/132,912, filed on Dec. 31, 2020.

(51) Int. Cl.
| | | |
|---|---|---|
| H01L 25/065 | (2023.01) | |
| H01L 25/00 | (2006.01) | |
| H01L 25/10 | (2006.01) | |
| H01L 25/18 | (2023.01) | |

(52) U.S. Cl.
CPC ........ *H01L 25/0657* (2013.01); *H01L 25/105* (2013.01); *H01L 25/18* (2013.01); *H01L 25/50* (2013.01); *H01L 2225/06506* (2013.01); *H01L 2225/0651* (2013.01); *H01L 2225/06517* (2013.01); *H01L 2225/0652* (2013.01); *H01L 2225/06572* (2013.01); *H01L 2225/06589* (2013.01); *H01L 2225/1023* (2013.01); *H01L 2225/1058* (2013.01)

(58) Field of Classification Search
CPC ... H01L 25/0657; H01L 25/105; H01L 25/18; H01L 25/50; H01L 2225/0652; H01L 2225/06589; H01L 2225/1058
See application file for complete search history.

(56) References Cited

U.S. PATENT DOCUMENTS

| | | | |
|---|---|---|---|
| 7,405,474 B1 * | 7/2008 | Brophy | H01L 23/3677 257/E23.105 |
| 2005/0104196 A1 * | 5/2005 | Kashiwazaki | H01L 25/0657 257/E23.101 |
| 2022/0208728 A1 | 6/2022 | Monadgemi | |

* cited by examiner

*Primary Examiner* — Thanh Y. Tran
(74) *Attorney, Agent, or Firm* — Perkins Coie LLP (57) ABSTRACT

A semiconductor device assembly comprises a substrate including internal contacts on a first side and first external contacts on a second side. The assembly further comprises one or more first dies disposed over the first side and electrically coupled to the internal contacts, and a interposer having a length and a width less than a length and a width of the substrate, having inner contacts on a first side, and having second external contacts on a second side. The interposer is coupled to the second side of the substrate by one or more of the inner contacts. The assembly further comprises a second die disposed between the substrate and the interposer. The assembly further comprises first solder balls on the first external contacts, and second solder balls on the second external contacts. The first and second solder balls are configured to bond with co-planar package contacts.

19 Claims, 7 Drawing Sheets

Figure 10 ial Patent Application No. 63/132,
THERMALLY EFFICIENT SEMICONDUCTOR DEVICE ASSEMBLIES INCLUDING INTERPOSERS CARRYING A SUBSET OF THE EXTERNAL CONTACTS OF THE ASSEMBLY, AND METHODS OF MAKING THE SAME

CROSS-REFERENCE TO RELATED APPLICATIONS

This application is a continuation of U.S. patent application Ser. No. 17/384,729, filed Jul. 24, 2021; which claims priority to U.S. Provisional Patent Application No. 63/132,912, filed Dec. 31, 2020; each of which is incorporated herein by reference in its entirety.

TECHNICAL FIELD

The present disclosure generally relates to semiconductor devices, and more particularly relates to thermally efficient semiconductor device assemblies including interposers carrying a subset of the external contacts of the assembly, and methods of making the same.

BACKGROUND

Packaged semiconductor dies, including memory chips, microprocessor chips, and imager chips, typically include one or more semiconductor dies mounted on a substrate and encased in a protective covering or capped with a heat-conducting lid. In many applications, it is desirable for a semiconductor device assembly to be as thin as practicable. Moreover, as semiconductor devices become more powerful and generate more heat, it is desirable for a semiconductor device assembly to effectively conduct heat away from the included semiconductor devices. Accordingly, thinner and more thermally-efficient semiconductor device assembly designs and methods for making the same are desired.

DETAILED DESCRIPTION

Semiconductor device assemblies are incorporated in many products where package height is a concern, such as mobile phones, tablets, laptop computers and the like. Designing a thinner assembly can be a particular challenge when the various devices in the assembly vary widely in size. For example, a memory controller die may be so much smaller than a memory die disposed thereon that spacers are required to support the peripheries of the larger die over the smaller die, adding thickness, cost, and complexity to the assembly design. Further, as semiconductor devices become more powerful and generate more heat, it becomes more challenging to conduct heat away from the semiconductor devices in an assembly.

To address these challenges, embodiments of the present technology provide semiconductor device assemblies with interposers attached to a back side of a substrate, to which can be attached a controller die and a subset of the external contacts of the assembly. By locating a controller die between the assembly substrate and the interposer, the controller can be closer to an exterior surface of the assembly, facilitating the conduction of heat away from the controller die, without conducting the heat through the memory dies. Moreover, by providing a subset of the external package contacts on the interposer, a uniformly-spaced ball grid array can be used to communicate between the assembly and other higher-level devices to which it is attached, such that the assembly size need not be increased to accommodate the presence of the interposer on the back side of the substrate, where solder balls would normally be disposed.

Figure 1:
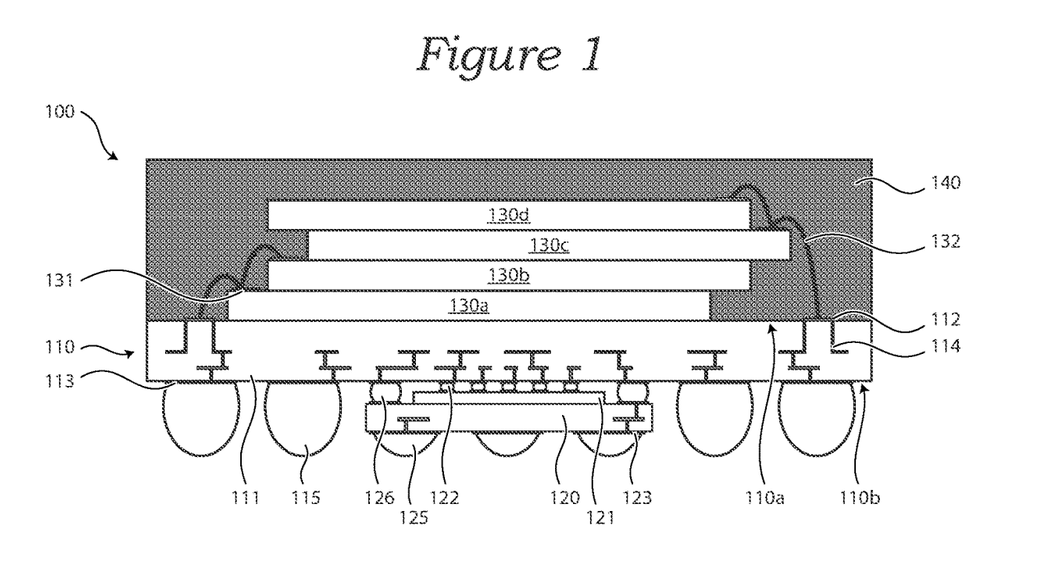
FIG. 1 is a schematic partial cross-sectional view of a semiconductor device assembly in accordance with one embodiment of the present technology.

In this regard, FIG. 1 illustrates a simplified schematic cross-sectional view of a semiconductor device assembly 100 in accordance with various embodiments of the present technology. As can be seen with reference to FIG. 1, assembly 100 includes a substrate 110, on a first side 110*a* of which are attached one or more first dies (e.g., memory dies such as NAND and/or DRAM memory dies) 130*a*-130*d*. The one or more first dies 130*a*-130*d* can be electrically connected to the substrate 110 by wirebonds 132 extending between contact pads 131 on each of the dies and the internal contacts 112 on the first side 110*a* of the substrate 110. The one or more first dies 130*a*-130*d* and the wirebonds 132 can be at least partially encapsulated by an encapsulant (e.g., mold material) 140 to provide structural integrity and environmental sealing therefor.

The assembly 100 further includes a interposer 120 and a second die (e.g., a controller die) 121 attached to a second side 110*b* of the substrate. In the present embodiment, the second die 121 is electrically coupled to a plurality of pads on the second side 110*b* of the substrate 110 by a plurality of interconnects (e.g., solder balls) 122 in a direct chip attach (DCA) configuration. The second die 121 can be attached to the interposer 120 (or vice versa) by an adhesive (e.g., die attach film or the like), or may in other embodiments be simply placed in contact with the interposer 120, rather than attached. The interposer 120 can be attached to the second side 110*b* of the substrate by forming interconnects (e.g., solder balls) 126 between pads on the interposer 120 and interposer contacts on the second side 110b of the substrate 110. The interposer 120 can be a printed circuit board (e.g., a daughter board), an organic substrate, a ceramic substrate, a metal lead frame, or even a redistribution layer (RDL).

The substrate 110 further includes a first plurality of external contacts 113 (e.g., peripherally surrounding the interposer 120), on which are formed a corresponding first plurality of solder balls 115. The solder balls of the first plurality 115 extend to a greater distance from the second side 110b of the substrate 110 than does a lower surface of the interposer 120, to facilitate connection of the assembly 110 to other system components. In accordance with one aspect of the present technology, the interposer 120 can also include a second plurality of external contacts 123, on which are formed a corresponding second plurality of solder balls 125. The second plurality of solder balls 125 each has a height less than the height of the first plurality of solder balls 115, such that the first and second pluralities of solder balls can bond with a co-planar array of package contacts on another device. In this regard, the spacing between adjacent ones of the first and second pluralities of solder balls can be uniform, such that together they form a uniformly-spaced ball grid array (BGA).

The one or more first dies 130a-130d, the second die 121, and the first and second pluralities of external solder balls 115 & 125 can be electrically coupled to one another through the substrate 110 by one or more conductive features (e.g., vias, traces, pads, etc.) 114 on and/or in a dielectric material 111 of the substrate 110. In this regard, the substrate may be a printed circuit board, an organic substrate, or even a redistribution layer (e.g., formed in accordance with a fan-out wafer-level packaging (FOWLP) process).

In accordance with various aspects of the present disclosure, the arrangement of FIG. 1 could be fabricated in one of several ways. In one embodiment, the second die 121 could be attached to the second side 110b of the substrate 110 first, and the interposer 120 subsequently attached to the second side 110b of the substrate 110 and either placed in contact with, or attached to, the lower surface of the second die 121. In another embodiment, the second die 121 could be attached to the interposer 120 first (e.g., with a die attach adhesive or the like), and the combined structure of both the interposer 120 and the second die 121 attached to the second side 110b of the substrate 110 in a subsequent operation. In either approach, the second die 121 and interposer 120 can be attached to the second side 110b of the substrate 110 either before or after attaching first dies 130a-130d to the first side 110a of the substrate and/or encapsulating them with the encapsulant 140.

In accordance with one aspect of the present technology, the heights of the first and second pluralities of solder balls 115 & 125, the thickness of the second die 121, the interposer 120, and the interconnects between the second die 121 and the substrate 110 can all be configured to ensure that the first plurality of solder balls 115 and the second plurality of solder balls 125 can readily bond with co-planar package contacts on another device. For example, in one exemplary embodiment of the assembly 100 of FIG. 1, the height of the first plurality of solder balls 115 can be about 218 µm, the thickness of the second die 212 can be about 40 µm, the thickness of the bond line between the second die 121 and the substrate 110 can be about 30 µm, the thickness of the interposer 120 can be about 30 µm, and the height of the second plurality of solder balls 125 can be about 118 µm, such that the bottom surfaces of the solder balls of each of the first and second plurality are substantially coplanar. In other embodiments, however, the distance between the second surface 110b of the substrate 110 and the bottoms of each of the first and second pluralities of solder balls 115 & 125 may vary, with the difference in height prior to reflow being accommodated by a reflow operation in which different degrees of slump are observed corresponding to the various volumes of the different pluralities of solder balls.

When a semiconductor device generates a large amount of heat (e.g., a memory controller die), a benefit of disposing it nearer an outer surface of an assembly can be the ease of conducting heat away from the device, potentially in a direction where the heat need not be conducted through other semiconductor devices. In this regard, locating such a high-power die on a interposer can permit the conduction of heat away from an assembly through the array of interconnects (e.g., solder balls) connecting the assembly to a larger system-level device, which may be better able to dissipate heat due to its larger size or additional heat-dissipating features (e.g., heat-radiating structures, fans, etc.). In this regard, FIG. 2 is a schematic partial cross-sectional view of a semiconductor device assembly 200 in accordance with one embodiment of the present technology in which heat extraction from the assembly 200 is facilitated by heat-conducting structures in a interposer thereof.

Figure 2:
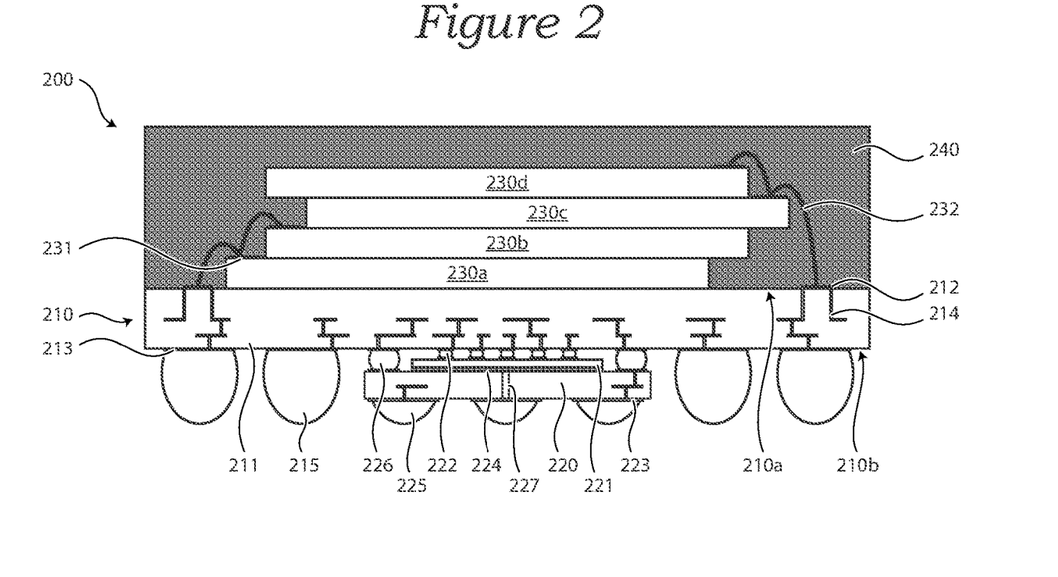
FIG. 2 is a schematic partial cross-sectional view of a semiconductor device assembly in accordance with one embodiment of the present technology.

As can be seen with reference to FIG. 2, assembly 200 includes a substrate 210, on a first side 210a of which are attached one or more first dies (e.g., memory dies such as NAND and/or DRAM memory dies) 230a-230d. The one or more first dies 230a-230d can be electrically connected to the substrate 210 by wirebonds 232 extending between contact pads 231 on each of the dies and the internal contacts 212 on the first side 210a of the substrate 210. The one or more first dies 230a-230d and the wirebonds 232 can be at least partially encapsulated by an encapsulant (e.g., mold material) 240 to provide structural integrity and environmental sealing therefor.

The assembly 200 further includes a interposer 220 and a second die (e.g., a controller die) 221 attached to a second side 210b of the substrate. The interposer 220 can be attached to the second side 210b of the substrate by forming interconnects (e.g., solder balls) 226 between pads on the interposer 220 and interposer contacts on the second side 210b of the substrate 210. The second die 221 can be electrically coupled to a plurality of pads on the second side 210b of the substrate 210 by a plurality of interconnects (e.g., solder balls) 222 in a direct chip attach (DCA) configuration. The second die 221 can be attached to the interposer 220 (or vice versa) by a thermal interface material (TIM) 224, which can facilitate heat transfer from the second die 221 to a heat-conducting structure (e.g., one or more thermal vias) 227 passing at least partially through the interposer 220. The interposer 220 can be a printed circuit board (e.g., a daughter board), an organic substrate, a ceramic substrate, a metal lead frame, or even a redistribution layer.

The substrate 210 further includes a first plurality of external contacts 213 (e.g., peripherally surrounding the interposer 220), on which are formed a corresponding first plurality of solder balls 215. The solder balls of the first plurality 215 extend to a greater distance from the second side 210b of the substrate 210 than does a lower surface of the interposer 220, to facilitate connection of the assembly 210 to other system components. The interposer 220 can also include a second plurality of external contacts 223, on which are formed a corresponding second plurality of solder balls 225. The second plurality of solder balls 225 each has a height less than the height of the first plurality of solder balls 215, such that the first and second pluralities of solder balls can bond with a co-planar array of package contacts on another device. In this regard, the spacing between adjacent ones of the first and second pluralities of solder balls can be uniform, such that together they form a uniformly-spaced ball grid array (BGA).

The heat-conducting structure 227 can conduct heat away from the second die 221, through the interposer 220, to one or more of the second plurality of solder balls 225. The one or more solder balls of the second plurality 225 to which the heat-conducting structure 227 is coupled (e.g., via a pad, under bump metallization (UBM) or the like) may be a "dummy" solder ball to which signal, ground, and/or power are not applied, or in other embodiments may be a "live" solder ball to which one or more of signal, ground, and/or power are applied.

The one or more first dies 230a-230d, the second die 221, and the first and second pluralities of external solder balls 215 & 225 can be electrically coupled to one another through the substrate 210 by one or more conductive features (e.g., vias, traces, pads, etc.) 214 on and/or in a dielectric material 211 of the substrate 210. In this regard, the substrate may be a printed circuit board, an organic substrate, or even a redistribution layer (e.g., formed in accordance with a fan-out wafer-level packaging (FOWLP) process).

In accordance with various aspects of the present disclosure, the arrangement of FIG. 2 could be fabricated in one of several ways. In one embodiment, the second die 221 could be attached to the second side 210b of the substrate 210 first, and the interposer 220 subsequently attached to the second side 210b of the substrate 210 and adhered to the lower surface of the second die 221 by the TIM 224. In another embodiment, the second die 221 could be attached by the TIM 224 to the interposer 220 first, and the combined structure of both the interposer 220 and the second die 221 attached to the second side 210b of the substrate 210 in a subsequent operation. In either approach, the second die 221 and interposer 220 can be attached to the second side 210b of the substrate 210 either before or after attaching first dies 230a-230d to the first side 210a of the substrate and/or encapsulating them with the encapsulant 240.

In accordance with one aspect of the present technology, the heights of the first and second pluralities of solder balls 215 & 225, the thickness of the second die 221, the interposer 220, and the interconnects between the second die 221 and the substrate 210 can all be configured to ensure that the first plurality of solder balls 215 and the second plurality of solder balls 225 can readily bond with co-planar package contacts on another device.

Figure 3:
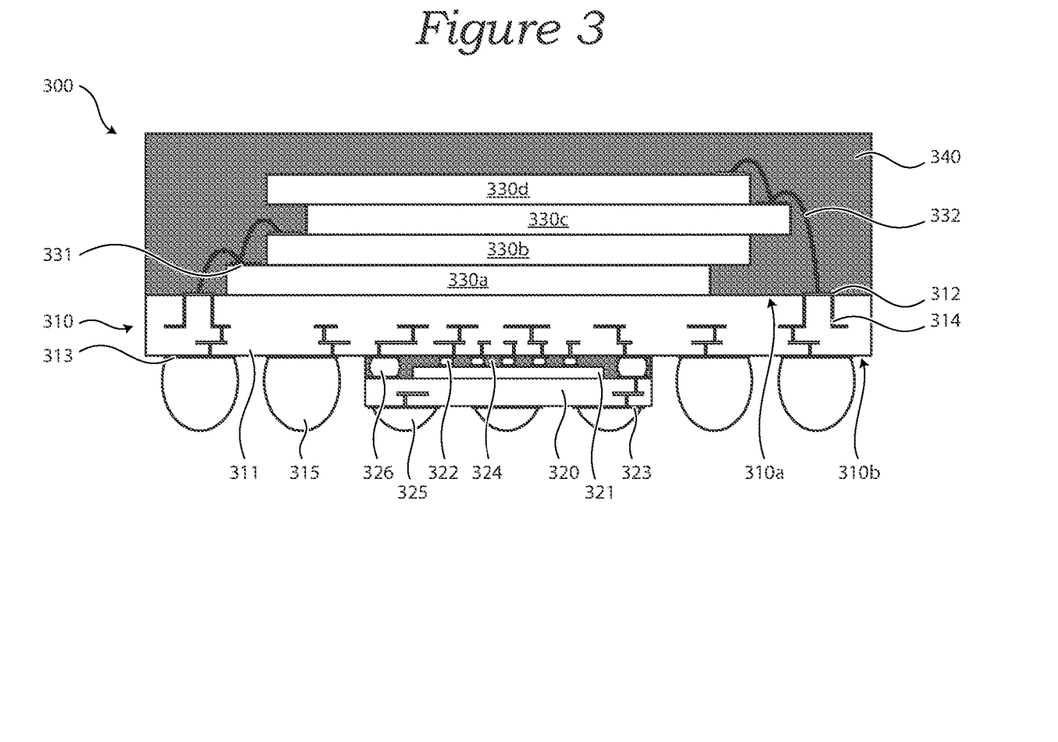
FIG. 3 is a schematic partial cross-sectional view of a semiconductor device assembly in accordance with one embodiment of the present technology.

In yet another embodiment, a semiconductor device assembly can include a second die and interposer at least partially encapsulated by a capillary underfill (CUF) or a mold compound underfill (MUF). In this regard, FIG. 3 is a schematic partial cross-sectional view of such a semiconductor device assembly 300 in accordance with one embodiment of the present technology. As can be seen with reference to FIG. 3, assembly 300 includes a substrate 310, on a first side 310a of which are attached one or more first dies (e.g., memory dies such as NAND and/or DRAM memory dies) 330a-330d. The one or more first dies 330a-330d can be electrically connected to the substrate 310 by wirebonds 332 extending between contact pads 331 on each of the dies and the internal contacts 312 on the first side 310a of the substrate 310. The one or more first dies 330a-330d and the wirebonds 332 can be at least partially encapsulated by an encapsulant (e.g., mold material) 340 to provide structural integrity and environmental sealing therefor.

The assembly 300 further includes a interposer 320 and a second die (e.g., a controller die) 321 attached to a second side 310b of the substrate. In the present embodiment, the second die 321 is electrically coupled to a plurality of pads on the second side 310b of the substrate 310 by a plurality of interconnects (e.g., solder balls) 322 in a direct chip attach (DCA) configuration. The second die 321 can be attached to the interposer 320 (or vice versa) by an adhesive (e.g., die attach film or the like), or may in other embodiments be simply placed in contact with the interposer 320, rather than attached. The interposer 320 can be attached to the second side 310b of the substrate by forming interconnects (e.g., solder balls) 326 between pads on the interposer 320 and interposer contacts on the second side 310b of the substrate 310. An underfill material (e.g., capillary underfill, mold compound underfill, etc.) 324 can then be introduced between the interposer 320 and the second side 310b of the substrate 310, to provide structural integrity and environmental sealing for the second die 321. The interposer 320 can be a printed circuit board (e.g., a daughter board), an organic substrate, a ceramic substrate, a metal lead frame, or even a redistribution layer.

The substrate 310 further includes a first plurality of external contacts 313 (e.g., peripherally surrounding the interposer 320), on which are formed a corresponding first plurality of solder balls 315. The solder balls of the first plurality 315 extend to a greater distance from the second side 310b of the substrate 310 than does a lower surface of the interposer 320, to facilitate connection of the assembly 310 to other system components. In accordance with one aspect of the present technology, the interposer 320 can also include a second plurality of external contacts 323, on which are formed a corresponding second plurality of solder balls 325. The second plurality of solder balls 325 each has a height less than the height of the first plurality of solder balls 315, such that the first and second pluralities of solder balls can bond with a co-planar array of package contacts on another device. In this regard, the spacing between adjacent ones of the first and second pluralities of solder balls can be uniform, such that together they form a uniformly-spaced ball grid array (BGA).

In accordance with one aspect of the present technology, the heights of the first and second pluralities of solder balls 315 & 325, the thickness of the second die 321, the interposer 320, and the interconnects between the second die 321 and the substrate 310 can all be configured to ensure that the first plurality of solder balls 315 and the second plurality of solder balls 325 can readily bond with co-planar package contacts on another device.

The one or more first dies 330a-330d, the second die 321, and the first and second pluralities of external solder balls 315 & 325 can be electrically coupled to one another through the substrate 310 by one or more conductive features (e.g., vias, traces, pads, etc.) 314 on and/or in a dielectric material 311 of the substrate 310. In this regard, the substrate may be a printed circuit board, an organic substrate, or even a redistribution layer (e.g., formed in accordance with a fan-out wafer-level packaging (FOWLP) process).

Figure 4:
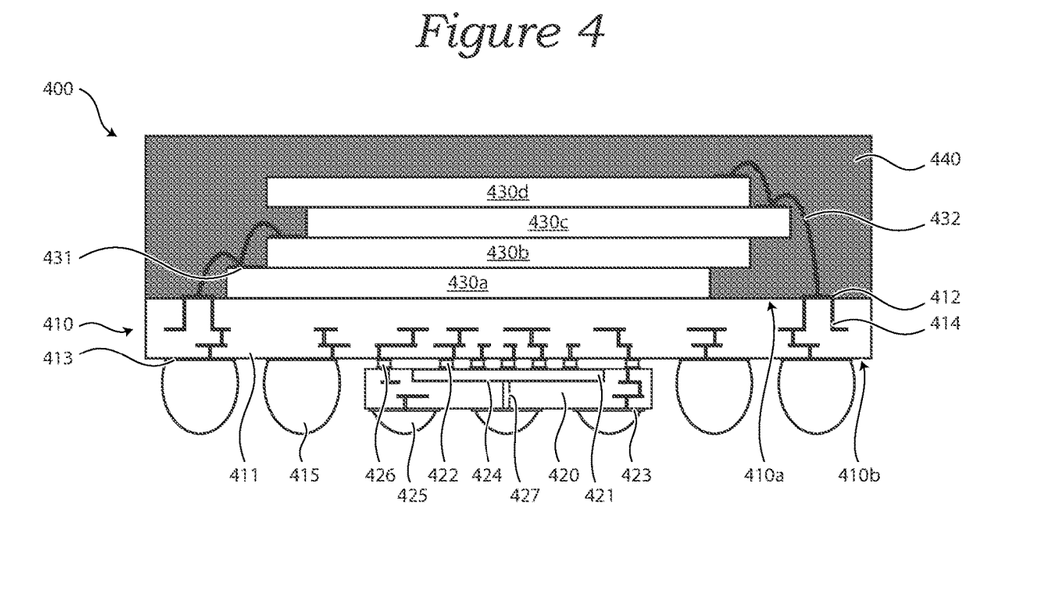
FIG. 4 is a schematic partial cross-sectional view of a semiconductor device assembly in accordance with one embodiment of the present technology.

In yet another embodiment, rather than attaching a second die to a surface of a interposer, a second die can be embedded at least partially in a interposer. In this regard, FIG. 4 is a schematic partial cross-sectional view of such a semiconductor device assembly 400 in accordance with one embodiment of the present technology. As can be seen with reference to FIG. 4, assembly 400 includes a substrate 410, on a first side 410a of which are attached one or more first dies (e.g., memory dies such as NAND and/or DRAM memory dies) 430a-430d. The one or more first dies 430a-430d can be electrically connected to the substrate 410 by wirebonds 432 extending between contact pads 431 on each of the dies and the internal contacts 412 on the first side 410a of the substrate 410. The one or more first dies 430a-430d and the wirebonds 432 can be at least partially encapsulated by an encapsulant (e.g., mold material) 440 to provide structural integrity and environmental sealing therefor. The interposer 420 can be a printed circuit board (e.g., a daughter board), an organic substrate, a ceramic substrate, a metal lead frame, or even a redistribution layer.

The assembly 400 further includes a interposer 420 and a second die (e.g., a controller die) 421 attached to a second side 410b of the substrate. In the present embodiment, the second die 421 is electrically coupled to a plurality of pads on the second side 410b of the substrate 410 by a plurality of interconnects (e.g., solder balls) 422 in a direct chip attach (DCA) configuration. The second die 421 can be at least partially embedded within the interposer 420. The interposer 420 can be attached to the second side 410b of the substrate by forming interconnects (e.g., solder balls) 426 between pads on the interposer 420 and interposer contacts on the second side 410b of the substrate 410.

The substrate 410 further includes a first plurality of external contacts 413 (e.g., peripherally surrounding the interposer 420), on which are formed a corresponding first plurality of solder balls 415. The solder balls of the first plurality 415 extend to a greater distance from the second side 410b of the substrate 410 than does a lower surface of the interposer 420, to facilitate connection of the assembly 410 to other system components. In accordance with one aspect of the present technology, the interposer 420 can also include a second plurality of external contacts 423, on which are formed a corresponding second plurality of solder balls 425. The second plurality of solder balls 425 each has a height less than the height of the first plurality of solder balls 415, such that the first and second pluralities of solder balls can bond with a co-planar array of package contacts on another device. In this regard, the spacing between adjacent ones of the first and second pluralities of solder balls can be uniform, such that together they form a uniformly-spaced ball grid array (BGA).

The one or more first dies 430a-430d, the second die 421, and the first and second pluralities of external solder balls 415 & 425 can be electrically coupled to one another through the substrate 410 by one or more conductive features (e.g., vias, traces, pads, etc.) 414 on and/or in a dielectric material 411 of the substrate 410. In this regard, the substrate may be a printed circuit board, an organic substrate, or even a redistribution layer (e.g., formed in accordance with a fan-out wafer-level packaging (FOWLP) process).

In accordance with one aspect of the present technology, the heights of the first and second pluralities of solder balls 415 & 425, the thickness of the second die 421, the interposer 420, and the interconnects between the second die 421 and the substrate 410 can all be configured to ensure that the first plurality of solder balls 415 and the second plurality of solder balls 425 can readily bond with co-planar package contacts on another device. For example, in one exemplary embodiment of the assembly 400 of FIG. 4, the height of the first plurality of solder balls 415 can be about 218 µm, the thickness of the bond line between the second die 421 and the substrate 410 can be about 30 µm, the thickness of the interposer 420 can be about 70 µm, and the height of the second plurality of solder balls 425 can be about 418 µm, such that the bottom surfaces of the solder balls of each of the first and second plurality are substantially coplanar. In other embodiments, however, the distance between the second surface 410b of the substrate 410 and the bottoms of each of the first and second pluralities of solder balls 415 & 425 may vary, with the difference in height prior to reflow being accommodated by a reflow operation in which different degrees of slump are observed corresponding to the various volumes of the different pluralities of solder balls.

Figure 5:
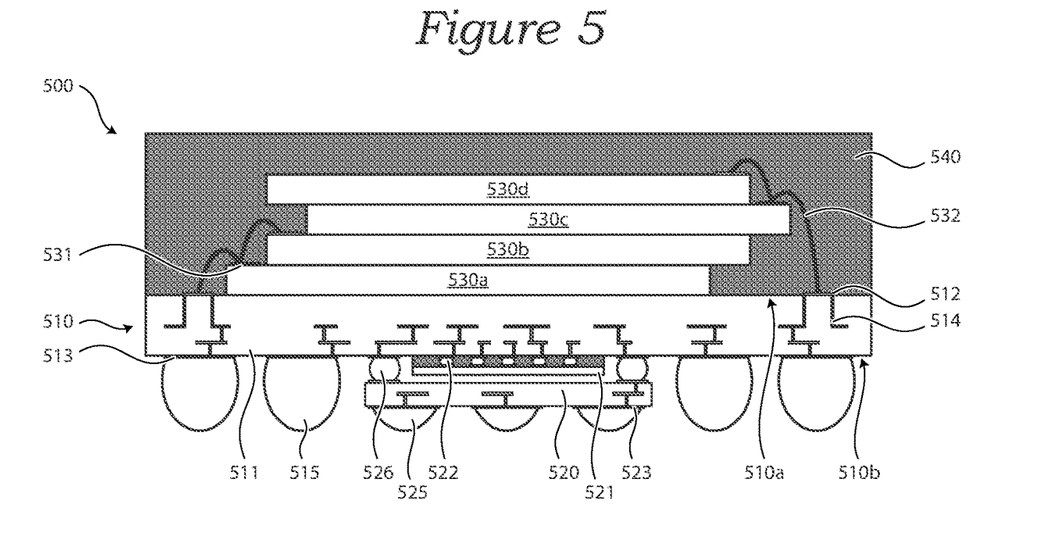
FIG. 5 is a schematic partial cross-sectional view of a semiconductor device assembly in accordance with one embodiment of the present technology.

Although in the foregoing example embodiments, semiconductor device assemblies have been illustrated and described as having interposers that are attached to second dies on a second side of a substrate, in other embodiments of the present technology a interposer may not contact a second die on a second side of the substrate at all. In this regard, FIG. 5 illustrates a simplified schematic cross-sectional view of a semiconductor device assembly 500 in accordance with various embodiments of the present technology. As can be seen with reference to FIG. 5, assembly 500 includes a substrate 510, on a first side 510a of which are attached one or more first dies (e.g., memory dies such as NAND and/or DRAM memory dies) 530a-530d. The one or more first dies 530a-530d can be electrically connected to the substrate 510 by wirebonds 532 extending between contact pads 531 on each of the dies and the internal contacts 512 on the first side 510a of the substrate 510. The one or more first dies 530a-530d and the wirebonds 532 can be at least partially encapsulated by an encapsulant (e.g., mold material) 540 to provide structural integrity and environmental sealing therefor.

The assembly 500 further includes a interposer 520 and a second die (e.g., a controller die) 521, each attached to a second side 510b of the substrate. In the present embodiment, the second die 521 is electrically coupled to a plurality of pads on the second side 510b of the substrate 510 by a plurality of interconnects (e.g., solder balls) 522 in a direct chip attach (DCA) configuration. The second die 521 can be spaced apart from the interposer 520, rather than attached thereto or in contact therewith. The interposer 520 can extend over the second die 521 and be attached to the second side 510b of the substrate by forming interconnects (e.g., solder balls) 526 between pads on the interposer 520 and interposer contacts on the second side 510b of the substrate 510. The interposer 520 can be a printed circuit board (e.g., a daughter board), an organic substrate, a ceramic substrate, a metal lead frame, or even a redistribution layer.

The substrate 510 further includes a first plurality of external contacts 513 (e.g., peripherally surrounding the interposer 520), on which are formed a corresponding first plurality of solder balls 515. The solder balls of the first plurality 515 extend to a greater distance from the second side 510b of the substrate 510 than does a lower surface of the interposer 520, to facilitate connection of the assembly 510 to other system components. In accordance with one aspect of the present technology, the interposer 520 can also include a second plurality of external contacts 523, on which are formed a corresponding second plurality of solder balls 525. The second plurality of solder balls 525 each has a height less than the height of the first plurality of solder balls 515, such that the first and second pluralities of solder balls can bond with a co-planar array of package contacts on another device. In this regard, the spacing between adjacent ones of the first and second pluralities of solder balls can be uniform, such that together they form a uniformly-spaced ball grid array (BGA).

The one or more first dies 530a-530d, the second die 521, and the first and second pluralities of external solder balls 515 & 525 can be electrically coupled to one another through the substrate 510 by one or more conductive features (e.g., vias, traces, pads, etc.) 514 on and/or in a dielectric material 511 of the substrate 510. In this regard, the substrate may be a printed circuit board, an organic substrate, or even a redistribution layer (e.g., formed in accordance with a fan-out wafer-level packaging (FOWLP) process).

In accordance with one aspect of the present technology, the heights of the first and second pluralities of solder balls 515 & 525, the thickness of the second die 521, the interposer 520, and the interconnects between the second die 521 and the substrate 510 can all be configured to ensure that the first plurality of solder balls 515 and the second plurality of solder balls 525 can readily bond with co-planar package contacts on another device.

Figure 6:
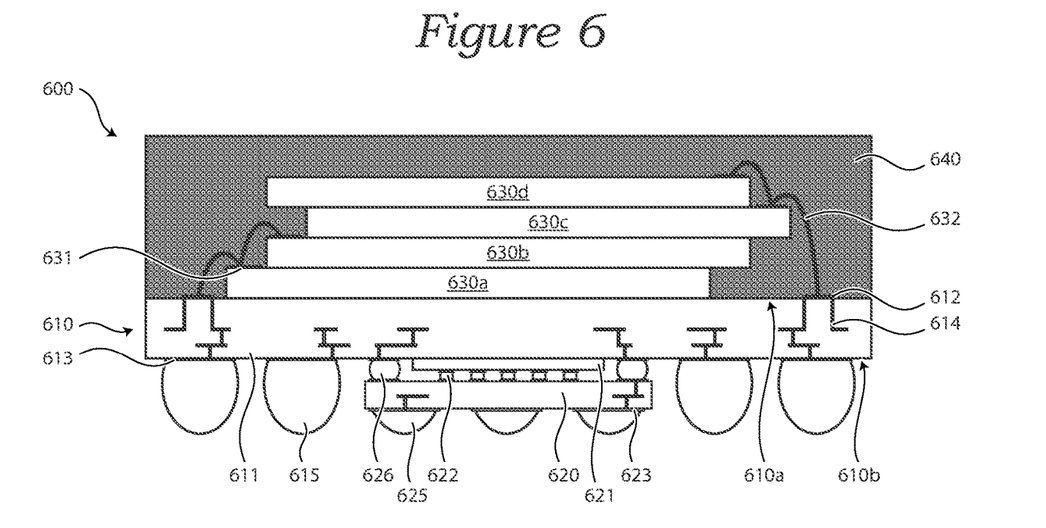
FIG. 6 is a schematic partial cross-sectional view of a semiconductor device assembly in accordance with one embodiment of the present technology.

Although in the foregoing examples, second dies have been illustrated and described as being directly electrically coupled to a second side of a substrate in a semiconductor device assembly, in other embodiments a second die can be electrically coupled to a substrate through a interposer, rather than coupled directly to the substrate. In this regard, FIG. 6 illustrates a simplified schematic cross-sectional view of a semiconductor device assembly 600 in accordance with various embodiments of the present technology. As can be seen with reference to FIG. 6, assembly 600 includes a substrate 610, on a first side 610a of which are attached one or more first dies (e.g., memory dies such as NAND and/or DRAM memory dies) 630a-630d. The one or more first dies 630a-630d can be electrically connected to the substrate 610 by wirebonds 632 extending between contact pads 631 on each of the dies and the internal contacts 612 on the first side 610a of the substrate 610. The one or more first dies 630a-630d and the wirebonds 632 can be at least partially encapsulated by an encapsulant (e.g., mold material) 640 to provide structural integrity and environmental sealing therefor.

The assembly 600 further includes a interposer 620 attached to a second side 610b of the substrate, to which is attached a second die (e.g., a controller die) 621. In the present embodiment, the second die 621 is electrically coupled to a plurality of pads on the interposer 620 by a plurality of interconnects (e.g., solder balls) 622 in a direct chip attach (DCA) configuration. The second die 621 can be attached to the second side 610b of the substrate 610 (or vice versa) by an adhesive (e.g., die attach film or the like), or may in other embodiments be simply placed in contact with the second side 610b of the substrate 610, rather than attached. Alternatively, the second die 621 may be spaced apart from the second side 610b of the substrate 610 by a gap. The interposer 620 can be attached to the second side 610b of the substrate by forming interconnects (e.g., solder balls) 626 between pads on the interposer 620 and interposer contacts on the second side 610b of the substrate 610. The interposer 620 can be a printed circuit board (e.g., a daughter board), an organic substrate, a ceramic substrate, a metal lead frame, or even a redistribution layer.

The substrate 610 further includes a first plurality of external contacts 613 (e.g., peripherally surrounding the interposer 620), on which are formed a corresponding first plurality of solder balls 615. The solder balls of the first plurality 615 extend to a greater distance from the second side 610b of the substrate 610 than does a lower surface of the interposer 620, to facilitate connection of the assembly 610 to other system components. In accordance with one aspect of the present technology, the interposer 620 can also include a second plurality of external contacts 623, on which are formed a corresponding second plurality of solder balls 625. The second plurality of solder balls 625 each has a height less than the height of the first plurality of solder balls 615, such that the first and second pluralities of solder balls can bond with a co-planar array of package contacts on another device. In this regard, the spacing between adjacent ones of the first and second pluralities of solder balls can be uniform, such that together they form a uniformly-spaced ball grid array (BGA).

The one or more first dies 630a-630d, the second die 621, and the first and second pluralities of external solder balls 615 & 625 can be electrically coupled to one another through the substrate 610 by one or more conductive features (e.g., vias, traces, pads, etc.) 614 on and/or in a dielectric material 611 of the substrate 610. In this regard, the substrate may be a printed circuit board, an organic substrate, or even a redistribution layer (e.g., formed in accordance with a fan-out wafer-level packaging (FOWLP) process).

In accordance with various aspects of the present disclosure, the arrangement of FIG. 6 could be fabricated in one of several ways. In one embodiment, the second die 621 could be attached to the second side 610b of the substrate 610 first (e.g., by an adhesive die attach film or the like), and the interposer 620 subsequently attached to the second side 610b of the substrate 610 and electrically coupled by the interconnects 622 to the second die 621. In another embodiment, the second die 621 could be attached to the interposer 620 first (e.g., by forming the interconnects 622), and the combined structure of both the interposer 620 and the second die 621 attached to the second side 610b of the substrate 610 in a subsequent operation. In either approach, the second die 621 and interposer 620 can be attached to the second side 610b of the substrate 610 either before or after attaching first dies 630a-630d to the first side 610a of the substrate and/or encapsulating them with the encapsulant 640.

In accordance with one aspect of the present technology, the heights of the first and second pluralities of solder balls 615 & 625, the thickness of the second die 621, the interposer 620, and the interconnects between the second die 621 and the substrate 610 can all be configured to ensure that the first plurality of solder balls 615 and the second plurality of solder balls 625 can readily bond with co-planar package contacts on another device.

Figure 7:
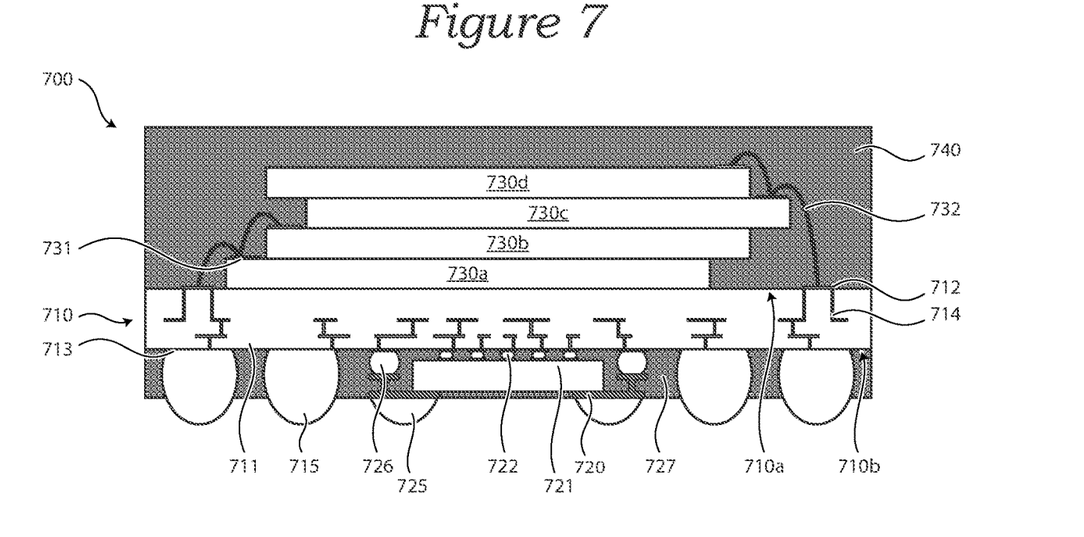
FIG. 7 is a schematic partial cross-sectional view of a semiconductor device assembly in accordance with one embodiment of the present technology.

Although in the foregoing examples, second dies have been illustrated and described as being coupled to an interposer, in other embodiments a second die can be coupled to a substrate by a lead frame that can in turn provide electrical connectivity to some of the solder balls of a package. In this regard, FIG. 7 illustrates a simplified schematic cross-sectional view of a semiconductor device assembly 700 in accordance with various embodiments of the present technology. As can be seen with reference to FIG. 7, assembly 700 includes a substrate 710, on a first side 710a of which are attached one or more first dies (e.g., memory dies such as NAND and/or DRAM memory dies) 730a-730d. The one or more first dies 730a-730d can be electrically connected to the substrate 710 by wirebonds 732 extending between contact pads 731 on each of the dies and the internal contacts 712 on the first side 710a of the substrate 710. The one or more first dies 730a-730d and the wirebonds 732 can be at least partially encapsulated by an encapsulant (e.g., mold material) 740 to provide structural integrity and environmental sealing therefor.

The assembly 700 further includes a lead frame 720 attached to a second side 710b of the substrate, to which is attached a second die (e.g., a controller die) 721. In the present embodiment, the second die 721 is electrically coupled to a plurality of pads on the second side 710*b* of the substrate 710 by a plurality of interconnects (e.g., solder balls) 722 in a direct chip attach (DCA) configuration. The lead frame 720 can be attached to the second side 710*b* of the substrate by forming interconnects (e.g., solder balls) 726.

The substrate 710 further includes a first plurality of external contacts 713 (e.g., peripherally surrounding the interposer 720), on which are formed a corresponding first plurality of solder balls 715. The solder balls of the first plurality 715 extend to a greater distance from the second side 710*b* of the substrate 710 than does a lower surface of the lead frame 720, to facilitate connection of the assembly 710 to other system components. In accordance with one aspect of the present technology, the lead frame 720 can also provide electrically conductive and solder-wettable surfaces on which are formed a corresponding second plurality of solder balls 725. The second plurality of solder balls 725 each has a height less than the height of the first plurality of solder balls 715, such that the first and second pluralities of solder balls can bond with a co-planar array of package contacts on another device. In this regard, the spacing between adjacent ones of the first and second pluralities of solder balls can be uniform, such that together they form a uniformly-spaced ball grid array (BGA). An additional layer of encapsulant 727 can also optionally be provided to cover the second side of the substrate 710*b*, leaving exposed upper portions of the plurality of solder balls 725.

The one or more first dies 730*a*-730*d*, the second die 721, and the first and second pluralities of external solder balls 715 & 725 can be electrically coupled to one another through the substrate 710 by one or more conductive features (e.g., vias, traces, pads, etc.) 714 on and/or in a dielectric material 711 of the substrate 710. In this regard, the substrate may be a printed circuit board, an organic substrate, or even a redistribution layer (e.g., formed in accordance with a fan-out wafer-level packaging (FOWLP) process).

In accordance with one aspect of the present technology, the heights of the first and second pluralities of solder balls 715 & 725, the thickness of the second die 721, the lead frame 720, and the interconnects between the second die 721 and the substrate 710 can all be configured to ensure that the first plurality of solder balls 715 and the second plurality of solder balls 725 can readily bond with co-planar package contacts on another device.

As set forth above, the spacing between adjacent ones of the first and second pluralities of solder balls in a semiconductor device assembly with a interposer can be uniform, such that together they form a uniformly-spaced ball grid array (BGA). One such arrangement is shown in FIG. 8, in which a schematic partial planar view of a semiconductor device assembly is illustrated in accordance with one embodiment of the present technology.

Figure 8:
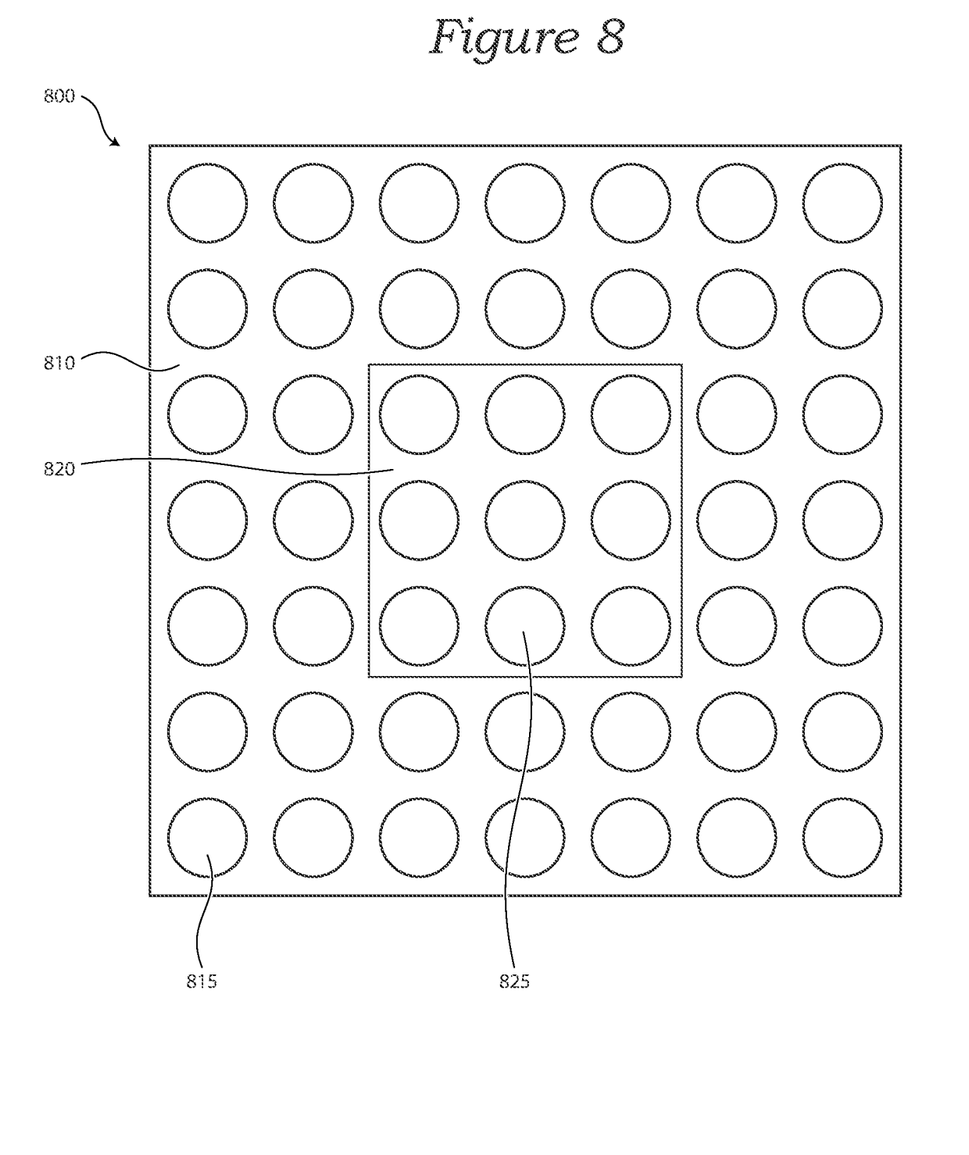
FIG. 8 is a schematic partial planar view of a semiconductor device assembly in accordance with one embodiment of the present technology.

As can be seen with reference to FIG. 8, assembly 800 includes a substrate 810, on a bottom side of which is disposed a first plurality of solder balls 815. Also on the bottom side of the substrate 810 is disposed a interposer, as set forth in greater detail above with reference to FIGS. 1-7, and on which is further disposed a second plurality of solder balls 825. The interposer 820 has a length and a width each less than both a length and a width of the substrate 810, such that the interposer 820 overlaps only a subset of the plan dimensions of the substrate 810. In another embodiment, the interposer 820 may have only one of a length or a width less than one of a length and a width of the substrate 810 (e.g., being smaller than the substrate 820 in only one of the x- or y-dimensions). The spacing between adjacent ones of the first plurality of solder balls 815 is the same as the spacing between adjacent ones of the second plurality of solder balls 825, as is the spacing between adjacent pairs of solder balls from each plurality (i.e. at the boundary of the interposer 820).

Although in the foregoing example embodiment, a semiconductor device assembly has been described and illustrated as having a interposer centrally located and surrounded by peripheral solder balls on the substrate, in other embodiments the interposer need not be so positioned. For example, the interposer could be offset from a central position, even all the way to an edge of the combined BGA. Moreover, although in the foregoing examples, semiconductor device assemblies have been described and illustrated as including a single interposer and a single second die on the second side of a substrate, in other embodiments of the present technology a semiconductor device assembly can include a interposer to which are attached multiple dies, and/or can include multiple interposers to which are attached one or more dies each, in a manner similar to those described above. Moreover, although the second dies on the second side of the substrate in the above-described examples have been identified as controller dies (e.g., for a managed NAND (mNAND) device), and the one or more dies in a stack disposed over the substrate opposite the interposer have been identified as memory dies (e.g., NAND or DRAM, or combinations thereof), those of skill in the art will readily appreciate that the foregoing assembly topologies can be adapted to other die types. For example, in addition to or in place of memory dies, other kinds of semiconductor devices can be provided in a semiconductor device assembly, such as logic dies, application-specific integrated circuit (ASIC) dies, field-programmable gate array (FPGA) dies, etc. In place of an embedded controller die, other die types can be embedded in a redistribution layer (e.g., memory dies, other logic dies, ASIC dies, FPGA dies, etc.).

Although in the foregoing examples, semiconductor device assemblies have been described and illustrated as including a plurality of memory die arranged in shingled stacks and connected to a substrate with wirebonds, in other embodiments of the present technology other arrangements of dies can similarly benefit from an assembly design incorporating a interposer and a second die on a second side of a substrate. For example, in addition to or in place of dies arranged in a shingled stack and connected by wirebonds, dies can be provided in vertical stacks and connected with other connection methodologies, such as TSVs, solder interconnects, copper-copper connections, hybrid bonding, etc. In some embodiments, rather than a plurality of dies, a semiconductor device assembly may include only a single die over a substrate to which is attached a interposer and a second die (e.g., in which the single die is attached via direct chip attach (DCA)). Those of skill in the art will appreciate that the foregoing list of examples is not exhaustive, but rather that many other semiconductor device assemblies can be similarly configured with a substrate to which is attached a interposer and one or more second dies, mutatis mutandis.

Figure 9:
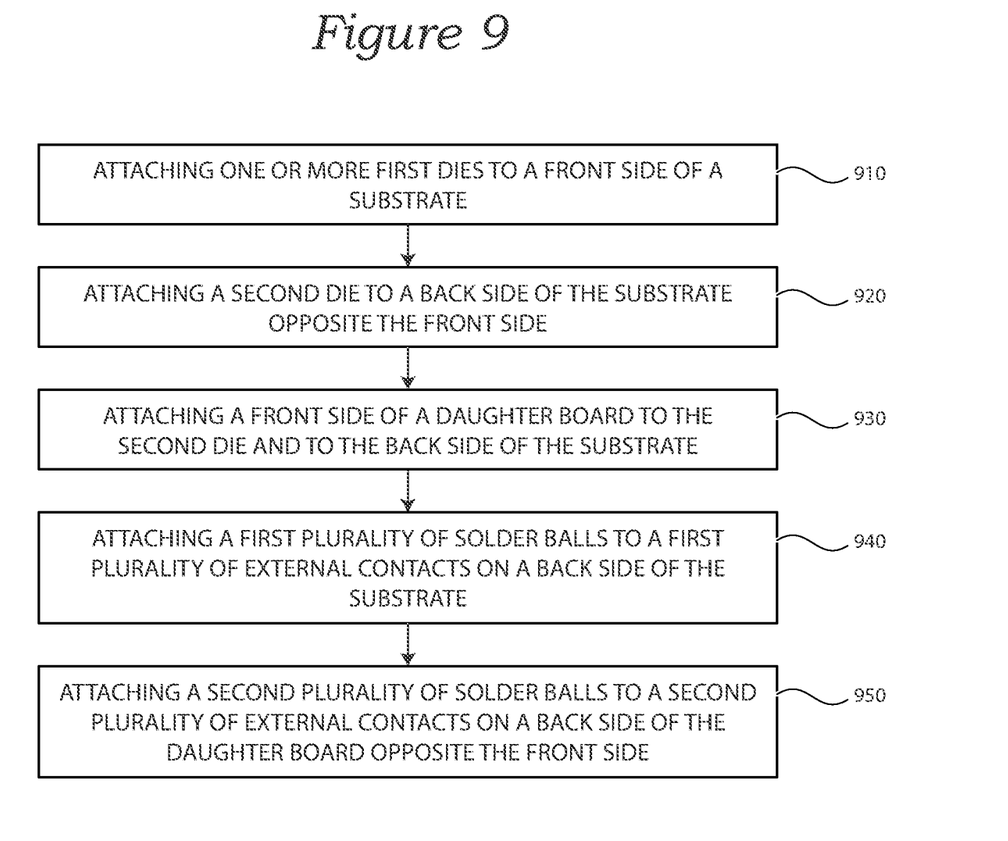
FIG. 9 is a flow chart illustrating a method of making a semiconductor device assembly in accordance with an embodiment of the present technology.

FIG. 9 is a flow chart illustrating a method of making a semiconductor device assembly. The method includes attaching one or more first dies to a front side of a substrate (box 910), attaching a second die to a back side of the substrate opposite the front side (box 920), and attaching a front side of a interposer to the second die and to the back side of the substrate (box 930). The method further includes attaching a first plurality of solder balls to a first plurality of external contacts on a back side of the substrate (box 940) and attaching a second plurality of solder balls to a second plurality of external contacts on a back side of the interposer opposite the front side (box 950). The first plurality of solder balls and the second plurality of solder balls are configured to bond with co-planar package contacts.

Figure 10:
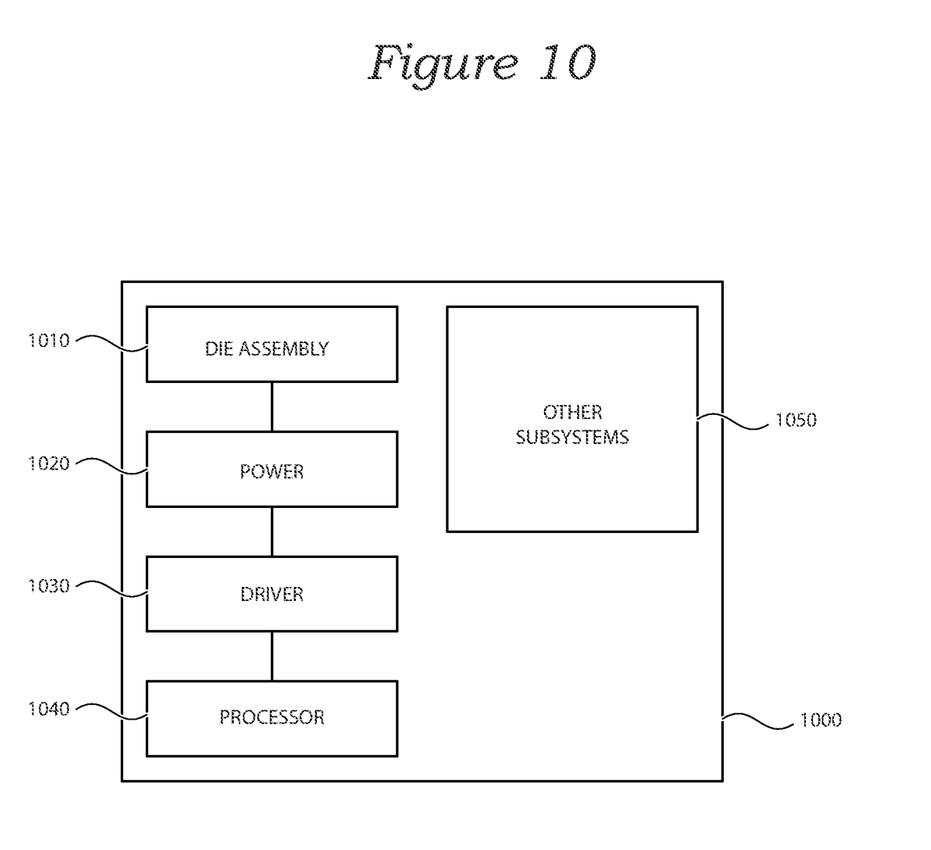
FIG. 10 is a schematic view showing a system that includes a semiconductor device assembly configured in accordance with an embodiment of the present technology.

Any one of the die support structures and/or semiconductor device assemblies described above with reference to FIGS. 1-9 can be incorporated into any of a myriad of larger and/or more complex systems, a representative example of which is system 1000 shown schematically in FIG. 10. The system 1000 can include a semiconductor device assembly 1010, a power source 1020, a driver 1030, a processor 1040, and/or other subsystems or components 1050. The semiconductor device assembly 1010 can include features generally similar to those of the semiconductor device assemblies described above. The resulting system 1000 can perform any of a wide variety of functions such as memory storage, data processing, and/or other suitable functions. Accordingly, representative systems 1000 can include, without limitation, hand-held devices (e.g., mobile phones, tablets, digital readers, and digital audio players), computers, vehicle and other machines and appliances. Components of the system 1000 may be housed in a single unit or distributed over multiple, interconnected units (e.g., through a communications network). The components of the system 1000 can also include remote devices and any of a wide variety of computer readable media.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
    a substrate including a first plurality of external contacts at a lowermost surface of the substrate;
    an interposer having a length and a width each less than both a length and a width of the substrate, the interposer having a plurality of inner contacts on a first side and having a second plurality of external contacts on a second side opposite the first side, the interposer coupled to the lowermost surface of the substrate at least in part by one or more of the plurality of inner contacts;
    a die disposed between the lowermost surface of the substrate and the first side of the interposer;
    a first plurality of solder balls disposed on corresponding ones of the first plurality of external contacts; and
    a second plurality of solder balls disposed on corresponding ones of the second plurality of external contacts,
    wherein the first plurality of solder balls and the second plurality of solder balls are configured to bond with co-planar package contacts.

2. The semiconductor device assembly of claim 1, wherein each of the first plurality of solder balls has a first height and each of the second plurality of solder balls has a second height less than the first height.

3. The semiconductor device assembly of claim 1, wherein the first plurality of solder balls extends farther from the substrate than the second side of the interposer.

4. The semiconductor device assembly of claim 1, wherein the first plurality of solder balls and second plurality of solder balls together form a uniformly-spaced ball grid array (BGA).

5. The semiconductor device assembly of claim 1, wherein the die is electrically coupled to a plurality of chip attach pads on the substrate by direct chip attach (DCA).

6. The semiconductor device assembly of claim 1, wherein the die is electrically coupled to one or more of the plurality of inner contacts on the first side of the interposer.

7. The semiconductor device assembly of claim 1, wherein the substrate further includes a plurality of interposer contacts surrounded by the first plurality of external contacts, and wherein the interposer is electrically coupled to the substrate by interconnects corresponding to the plurality of interposer contacts.

8. The semiconductor device assembly of claim 7, wherein the second plurality of external contacts are electrically coupled to corresponding ones of the plurality of interposer contacts by one or more electrically conductive features extending at least partially through the interposer.

9. The semiconductor device assembly of claim 1, wherein the interposer further includes one or more thermal vias configured to conduct heat from the die through the interposer to one or more of the second plurality of external contacts.

10. The semiconductor device assembly of claim 1, wherein the die is adhered to the interposer by a thermal interface material.

11. The semiconductor device assembly of claim 1, further comprising a layer of underfill material between the interposer and the substrate, the layer of underfill material at least partially surrounding the die.

12. The semiconductor device assembly of claim 1, wherein the interposer comprises one of a printed circuit board, an organic substrate, a ceramic substrate, a metal lead frame, or a redistribution layer.

13. The semiconductor device assembly of claim 12, wherein the interposer comprises a redistribution layer in which the die is at least partially embedded.

14. A method of forming a semiconductor device assembly, the method comprising:

attaching a die to a lowermost surface of a substrate;
attaching a front side of an interposer to the die and to the lowermost surface of the substrate;
attaching a first plurality of solder balls to a first plurality of external contacts on the lowermost surface of the substrate; and
attaching a second plurality of solder balls to a second plurality of external contacts on a back side of the interposer opposite the front side,
wherein the first plurality of solder balls and the second plurality of solder balls are configured to bond with co-planar package contacts.

15. The method of claim 14, wherein attaching the die to the lowermost surface of the substrate comprises electrically coupling the die to a plurality of pads on the second side of the substrate by direct chip attach (DCA).

16. The method of claim 14, further comprising electrically coupling the die to one or more of a plurality of inner contacts on the font side of the interposer.

17. The method of claim 14, wherein the substrate further includes a plurality of interposer contacts on the lowermost surface of the substrate, and wherein attaching the front side of the interposer to the lowermost surface of the substrate comprises electrically coupling the interposer to the plurality of interposer contacts.

18. The method of claim 14, wherein attaching the front side of the interposer to the die comprises disposing a thermal interface material between the front side of the interposer and the die.

19. The method of claim 14, further comprising disposing a layer of underfill material between the interposer and the substrate, the layer of underfill material at least partially surrounding the die.

* * * * *